(12) United States Patent
Lu et al.

(10) Patent No.: US 9,011,599 B2
(45) Date of Patent: Apr. 21, 2015

(54) METHOD OF TEMPERATURE DETERMINATION FOR DEPOSITION REACTORS

(75) Inventors: Jhi-Cherng Lu, Hsin-Chu (TW); Jr-Hung Li, Chupei (TW); Chii-Horng Li, Jhu-Bei (TW); Pang-Yen Tsai, Jhu-Bei (TW); Bing-Hung Chen, San-Xia Town (TW); Tze-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1232 days.

(21) Appl. No.: 12/835,789

(22) Filed: Jul. 14, 2010

(65) Prior Publication Data

US 2012/0012047 A1 Jan. 19, 2012

(51) Int. Cl.
*C30B 25/08* (2006.01)
*C30B 25/16* (2006.01)
*C30B 29/06* (2006.01)
*C30B 29/08* (2006.01)
*C30B 29/52* (2006.01)
*H01L 21/02* (2006.01)
*H01L 21/66* (2006.01)

(52) U.S. Cl.
CPC ............... *C30B 25/16* (2013.01); *C30B 29/06* (2013.01); *C30B 29/08* (2013.01); *C30B 29/52* (2013.01); *H01L 21/0245* (2013.01); *H01L 21/02532* (2013.01); *H01L 21/0262* (2013.01); *H01L 22/10* (2013.01); *H01L 22/12* (2013.01)

(58) Field of Classification Search
USPC .................. 117/201, 202, 86, 87, 88, 89, 935
See application file for complete search history.

(56) References Cited

U.S. PATENT DOCUMENTS

| 2006/0126701 A1* | 6/2006 | Nozawa et al. ............... 374/141 |
| 2006/0205194 A1* | 9/2006 | Bauer .......................... 438/542 |
| 2010/0180945 A1* | 7/2010 | Henley et al. ................. 136/256 |

* cited by examiner

*Primary Examiner* — Bob M Kunemund
(74) *Attorney, Agent, or Firm* — Duane Morris LLP

(57) ABSTRACT

A method of determining a temperature in a deposition reactor includes the steps of depositing a first epitaxial layer of silicon germanium on a substrate, depositing a second epitaxial layer of silicon above the first epitaxial layer, measuring the thickness of the second epitaxial layer and determining the temperature in the deposition reactor using the measured thickness of the second epitaxial layer. The method may also include heating the deposition reactor to approximately a predetermined temperature using a heating device and a temperature measuring device and generating a signal indicative of a temperature within the deposition reactor. The method may also contain the steps of comparing the measured thickness with a predetermined thickness of the second epitaxial layer corresponding to the predetermined temperature and determining the temperature in the deposition reactor using the measured thickness of the second epitaxial layer and the predetermined thickness of the second epitaxial layer.

19 Claims, 14 Drawing Sheets

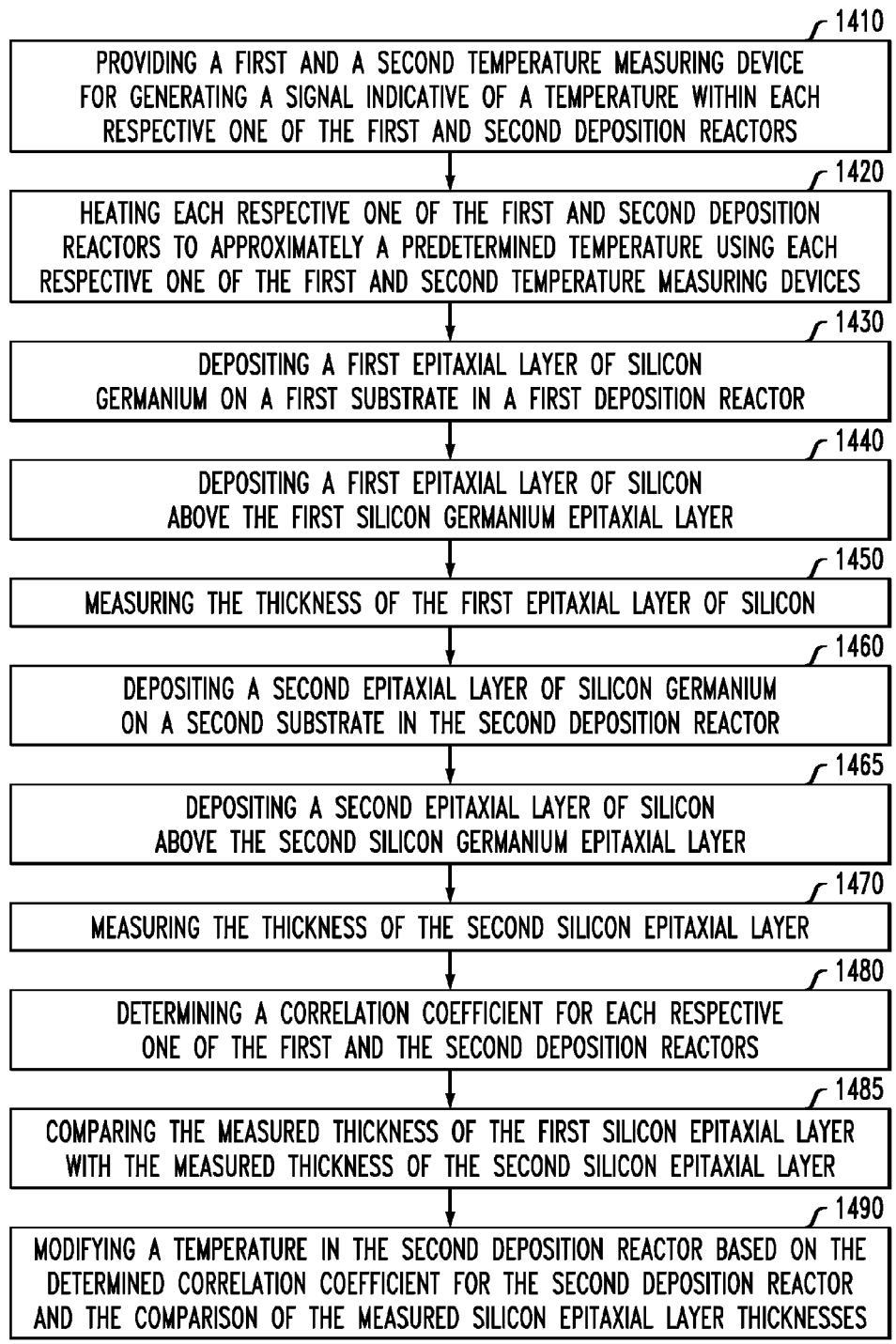

METHOD OF TEMPERATURE DETERMINATION FOR DEPOSITION REACTORS

FIELD OF THE INVENTION

The present disclosure is directed generally to processing substrates using chemical vapor deposition processes. In particular, the present disclosure relates to calibrating temperatures in deposition reactors forming thin films on substrates using chemical vapor deposition processes.

DESCRIPTION OF THE RELATED ART

Chemical vapor deposition (CVD) is a process conventionally used to deposit thin films of various materials on a substrate. CVD has become a valued method of thin film deposition for a wide variety of applications including semiconductors, optoelectronics, optics, and the like, due to its high throughput, high purity and low operating cost. In CVD processes, volatile chemical precursors, including the constituents of the thin film, are introduced into a deposition reactor and transported to a surface of the substrate to form a film on the surface. A thin film is formed as a consequence of one or more chemical reactions which change the state of the precursor. An energy source is conventionally used to break the precursors into reactive species for deposition. For example, heat is often used to thermally decompose the precursors. Typically, heating may be accomplished by the use of resistive heating, radiant heating or radio frequency (RF) induction heating of the precursors, the deposition reactor, and/or the substrate. CVD is advantageous over other deposition processes because high growth rates are possible. The process can deposit materials which are hard to evaporate, as it has good reproducibility and as it can be used to grow epitaxial films.

An epitaxial film or layer is a monocrystalline layer formed on a seed crystal. Epitaxial growth is deposition of a monocrystalline layer on a seed crystal that matches the crystalline order of the seed crystal. In homoepitaxy, the growth of the monocrystalline layer is of the same material as the seed crystal while in heteroepitaxy, the growth of the monocrystalline layer is of a different material than the seed crystal. Epitaxial growth is useful for applications that place stringent demands on a deposited layer such as, for example, high purity, low defect density, abrupt interfaces, controlled doping profiles, high repeatability and uniformity, and safe, efficient operation. For example, in bipolar devices, adding a lightly doped epitaxial layer above a heavily doped substrate (e.g. depositing an epitaxial layer over patterned heavily doped areas of the substrate referred to as buried layers) may increase the breakdown voltage of the collector/substrate junction.

Additionally, for example, in CMOS structures, depositing an epitaxial layer has the realized advantage of a smoother surface which provides a better gate oxide, and also no silicon oxide precipitates, unlike bare silicon substrates. Thus, including an epitaxial layer may provide less junction leakage due to defects. Epitaxial layers may be deposited using various methods including vapor phase epitaxy, liquid phase epitaxy and molecular beam epitaxy. For example, typically in vapor phase epitaxy, reactants are introduced as gases, a material to be deposited is bound to one or more ligands, the ligands dissociate allowing the desired chemistry to reach a deposition surface resulting in some desorption but more adsorbed atoms finding the proper crystallographic position. For example, in depositing a silicon epitaxial layer, $SiCl_4$ gas and hydrogen can be introduced into the deposition reactor as reactants to form silicon and HCl gas.

During CVD processes, the growth rate of the film (e.g. epitaxial layer) is limited by surface reaction kinetics, mass transport (diffusion) of precursors to the substrate, or feed rate of the precursors. Surface reaction kinetics often control the rate when growth occurs at lower temperatures (where the reactions occur slowly). Since reactants easily diffuse through the boundary layer, the amount of reactants at the surface is typically independent of deposition reactor pressure. Thus, it is the reactions of the precursors adsorbed on the deposition surface which will determine the overall growth rate of the film. In a surface reaction controlled deposition region, the surface reaction rate constant ($k_s$) is relatively small and highly temperature dependent. As shown in the Arrhenius equation, $R = R_0 e^{(-Ea/k_s T)}$, where R is the surface reaction rate, $R_0$ is the surface reaction rate constant of the gas, $E_a$ is the activation energy, T is the temperature and $k_s$ is the surface reaction rate constant, the surface reaction rate (R) is highly temperature dependent. The growth of the film is controlled by processes at the deposited surface, including adsorption, decomposition, surface migration, chemical reaction and desorption of products. Thus, in the surface reaction controlled region, it is critical to have precise temperature control.

On the other hand, mass transport is controlled by the diffusion of reactants through the boundary layer and diffusion of by-products out of the boundary layer. Mass transport often limits reactions when the temperature and pressure in the deposition reactor are high. Typically, these conditions increase the thickness of the boundary layer and make it harder for gases to diffuse through. Increasing the gas velocity will often decrease the boundary layer and increase the growth rate. Additionally, decomposition of the reactants is often quicker since the substrate is at a higher temperature. Thus, in the mass transport controlled region, it is critical to have precise gas mass flow rate control.

A plot of growth rate versus temperature, known as an Arrhenius plot, can be used to determine the rate limiting step of a reaction. FIG. 1 is an Arrhenius plot showing the deposition rate of Silicon from four different precursor gases ($SiH_4$, $Si_2H_2Cl_2$ or DCS, $SiHCl_3$ and $SiCl_4$) as a function of temperature. As shown in FIG. 1, in the surface reaction controlled region, the silicon growth rate is highly sensitive to changes in temperature. In the mass transfer controlled region, the silicon growth rate is much less sensitive to changes in temperature. Different precursor gases have different growth rates for the various temperatures shown. In the semiconductor industry, operations in the surface reaction controlled region are commonplace due to limited thermal budget requirements, and thus having precise process parameter control, especially of temperature, is critical.

FIG. 2 shows an Arrhenius plot showing the deposition rate of Silicon from a precursor gas ($Si_2H_2Cl_2$ or DCS) as a function of temperature and also showing the deposition rate of Germanium from a precursor gas ($GeH_4$ or Germane) as a function of temperature. As illustrated in FIG. 2, the curves for both precursors are distinct. While the silicon growth rate operates in the surface reaction controlled region for DCS at temperatures between approximately 600 degrees Celsius and 800 degrees Celsius, the germanium growth rate operates in the mass transfer controlled region for Germane at temperatures above approximately 500 degrees Celsius. Thus, the energy required to activate DCS is significantly higher than Germane. Additionally, having precise temperature control is critical to CVD processes (such as silicon or silicon germanium epitaxial layer CVD processes) performed in the surface reaction controlled region.

Thus, precise temperature determination, monitoring and calibration is essential in CVD processes including epitaxial layer deposition. Several methods are conventionally employed for these purposes. Statistical process control (SPC) monitoring systems for deposition reactors are often incapable of distinguishing between gas drifts or temperature drifts in a deposition reactor. For example, if depositing an epitaxial layer of silicon germanium using a thermal CVD process, where the germanium is in the mass transfer controlled region and the silicon is in the surface reaction controlled region, the SPC monitoring system cannot accurately reflect gas drift or temperature drift.

A conventional method of calibrating temperature in a deposition reactor is the sheet resistance ($R_s$) method. In the $R_s$ method, a boron-implanted n-type silicon substrate is baked in a hydrogen environment in a deposition reactor. After the baking, the sheet resistance is measured and a predetermined function is used to determine a corresponding temperature for the measured sheet resistance. While the $R_s$ method permits a temperature within a deposition reactor to be measured, this method requires the use of an implanted substrate and does not provide an adequately precise temperature measurement for minor temperature variations in the deposition reactor. Additionally, the $R_s$ is a destructive measurement with inherent instabilities. Such instabilities may interfere with the measurement results as the $R_s$ value may vary over time after exposure in the atmosphere ambient due to surface oxidation. Furthermore, it is understood that the $R_s$ measurement tools provide varying results under similar measurement conditions.

An additional method of calibrating temperature in a deposition reactor is the Poly Silicon method. In the Poly Silicon method, an oxide layer is deposited on a p-type or a n-type silicon substrate and a poly silicon layer is deposited on the oxide layer. A pre-measurement of the poly silicon layer thickness is taken. The prepared substrate is placed into a deposition reactor where it is heated and precursors are introduced into the deposition reactor, such as DCS and $H_2$, to deposit an epitaxial layer on the poly silicon layer. A second measurement is taken of the poly silicon layer thickness and the difference is used to determine a temperature in the deposition reactor. This method requires complex and time-consuming preparatory steps in preparing the substrate and also does not provide an adequately precise temperature measurement for minor temperature variations in the deposition reactor. Also, results vary across the edge of the substrate surface, and as a goodness-of-fit (GOF) between the measurements decreases, the accuracy of the measurements becomes questionable. Since the measurement error is increased in this method as two separate measurements are required to be taken, these measurement inaccuracies are particularly problematic. Thus, there remains a need in the art for a method of precise temperature measurement and calibration in a deposition reactor.

SUMMARY OF THE INVENTION

One embodiment of the present invention provides a method of determining a temperature in a deposition reactor including the steps of depositing a first epitaxial layer of silicon germanium on a substrate, depositing a second epitaxial layer of silicon above the first epitaxial layer, measuring the thickness of the second epitaxial layer and determining the temperature in the deposition reactor using the measured thickness of the second epitaxial layer and a predetermined relationship between the thickness of the second epitaxial layer and the temperature in the deposition reactor.

Another embodiment of the present invention provides a method including the steps of heating a deposition reactor, providing a temperature measuring device for generating a signal indicative of a temperature within the deposition reactor, heating the deposition reactor to a predetermined temperature determined by the temperature measuring device, depositing a first epitaxial layer of silicon germanium on a first substrate, depositing a second epitaxial layer of silicon above the first epitaxial layer, measuring the thickness of the second epitaxial layer, associating the measured thickness of the second epitaxial layer with the predetermined temperature and heating the deposition reactor to approximately the predetermined temperature determined by the temperature measuring device, depositing a third epitaxial layer of silicon germanium on a second substrate, depositing a fourth epitaxial layer of silicon above the third epitaxial layer, measuring the thickness of the fourth epitaxial layer, comparing the measured thickness of the fourth epitaxial layer with the measured thickness of the second epitaxial layer and adjusting the temperature measuring device based on the comparison of the measured thicknesses.

A further embodiment of the present invention provides a method including the steps of depositing a first epitaxial layer of silicon germanium on a first substrate in a first deposition reactor, depositing a first epitaxial layer of silicon above the first silicon germanium epitaxial layer, measuring the thickness of the first silicon epitaxial layer, depositing a second epitaxial layer of silicon germanium on a second substrate in a second deposition reactor. depositing a second epitaxial layer of silicon above the second silicon germanium epitaxial layer, measuring the thickness of the second silicon epitaxial layer, comparing the measured thickness of the first silicon epitaxial layer with the measured thickness of the second silicon epitaxial layer and modifying a temperature in the second deposition reactor based on the comparison of the measured silicon epitaxial layer thicknesses.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

FIG. 14 is a flow chart illustrating a method according to an embodiment of the present disclosure.

DETAILED DESCRIPTION OF THE EMBODIMENTS OF THE INVENTION

With reference to the Figures where like elements have been given like numerical designations to facilitate an understanding of the present invention, the various embodiments of a method of determining a temperature in a deposition reactor is provided.

The following description is provided as an enabling teaching of a representative set of examples. Those skilled in the art will recognize that many changes can be made to the embodiments described herein while still obtaining beneficial results. It will also be apparent that some of the desired benefits discussed below can be obtained by selecting some of the features or steps discussed herein without utilizing other features or steps. Accordingly, those who work in the art will recognize that many modifications and adaptations, as well as subsets of the features and steps described herein are possible and may even be desirable in certain circumstances. Thus, the following description is provided as illustrative and not limiting.

A solution is described below to the problem of precisely determining a temperature in a deposition reactor.

As used herein, use of a singular article such as "a," "an" and "the" is not intended to exclude pluralities of the article's object unless the context clearly and unambiguously dictates otherwise.

Figure 1:
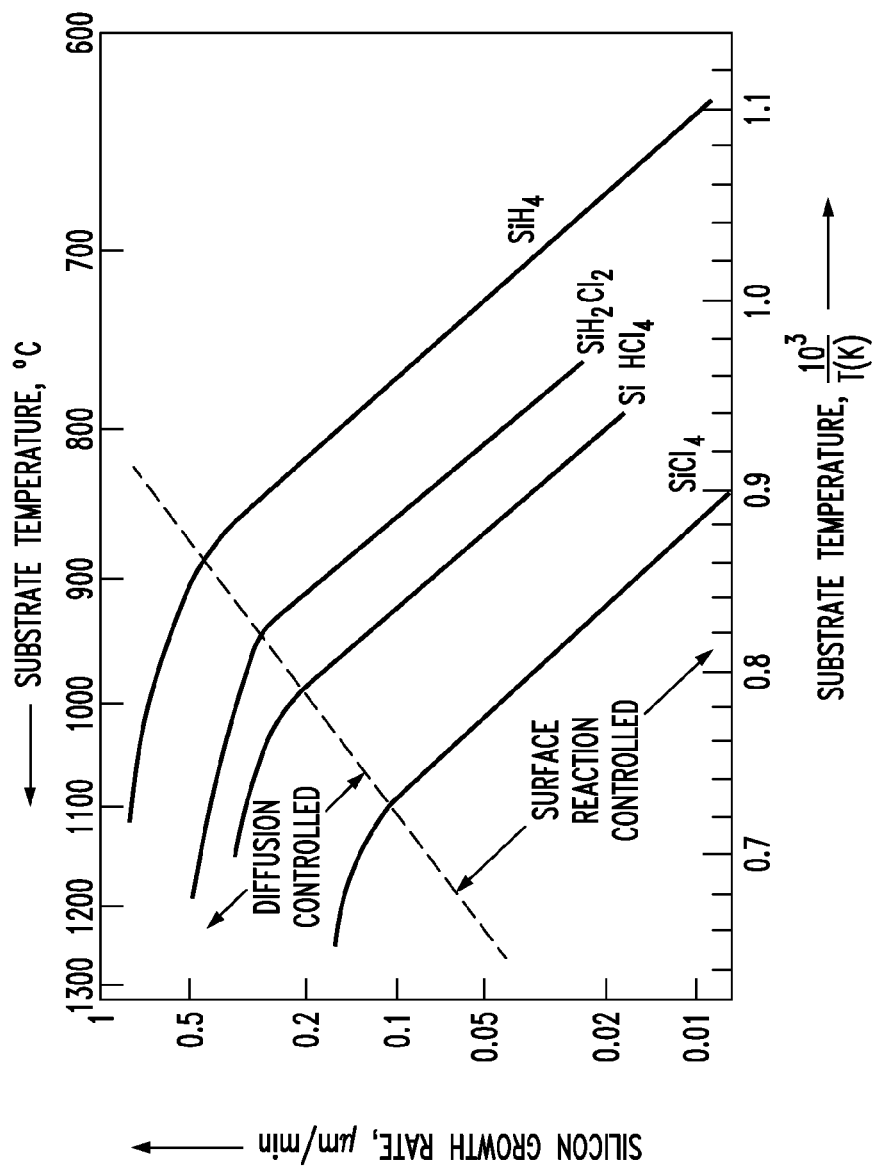
FIG. 1 is an Arrhenius plot showing the deposition rate of Silicon from four different precursor gases as a function of temperature.
Figure 2:
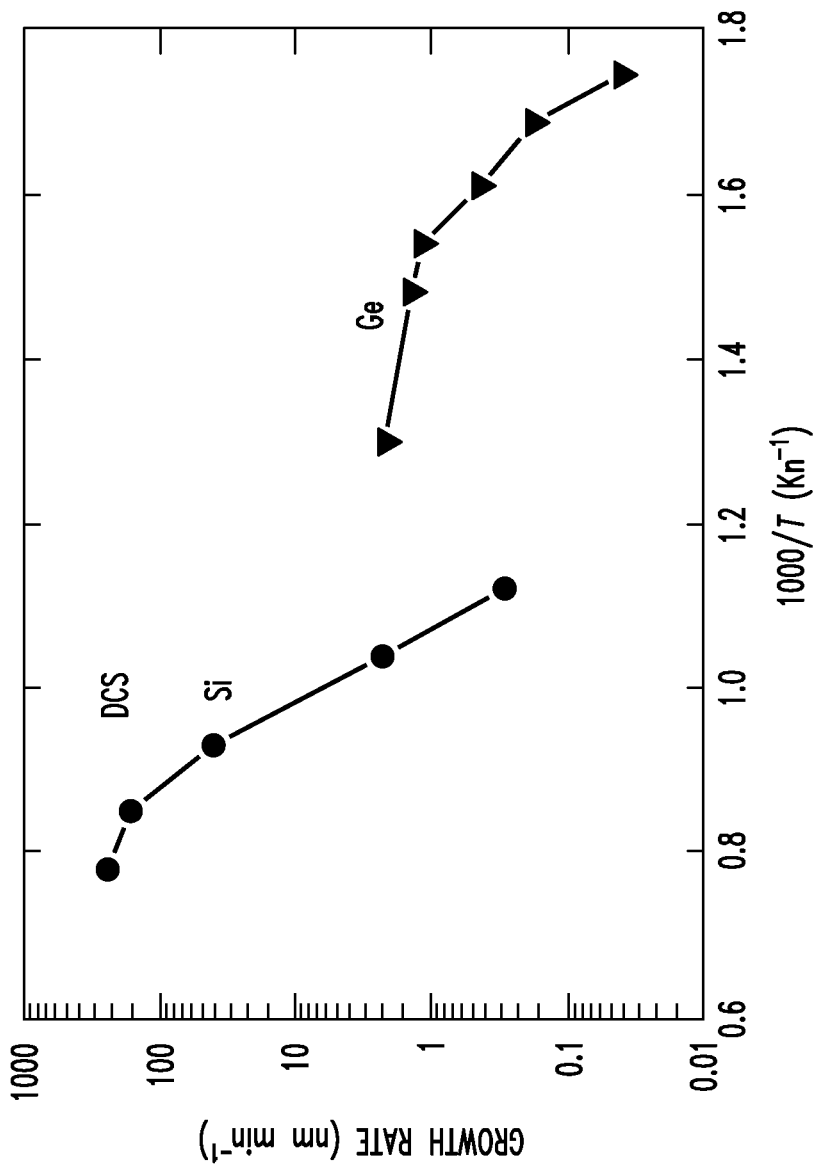
FIG. 2 is an Arrhenius plot showing the deposition rate of Silicon from a precursor gas as a function of temperature and also showing the deposition rate of Germanium from a precursor gas as a function of temperature.
Figure 3A:
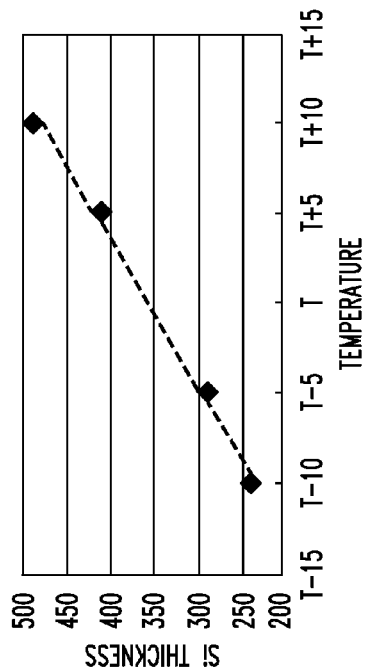
FIG. 3a is a plot showing the effect on the thickness of a silicon epitaxial layer deposited above a silicon germanium epitaxial layer on a substrate in a deposition reactor as a function of dichlorosilane (DCS) flow rate.

With reference now to FIGS. 3a through 3d, several examples showing the effect on the thickness of a silicon epitaxial layer deposited above a silicon germanium epitaxial layer on a substrate in a deposition reactor as a function of varying process parameters are provided. These examples are illustrative only and are not intended to limit the scope of the disclosure. It will be apparent to one skilled in the art that various modifications and variations can be made. The inventors have observed that the thickness of a silicon epitaxial layer deposited above a silicon germanium epitaxial layer on a substrate in a deposition reactor is largely unaffected by changes in the flow rate and density of precursor gases, flow rate and density of carrier gases, and changes in pressure in the deposition reactor when operating in the surface reaction controlled region illustrated in FIGS. 1 and 2. With reference to FIG. 3a, a plot showing an example of the effect on the thickness of a silicon epitaxial layer deposited above a silicon germanium epitaxial layer on a substrate in a deposition reactor as a function of dichlorosilane (DCS) flow rate is provided. In the example of FIG. 3a, the silicon epitaxial layer was deposited in the surface reaction controlled region using a CVD process including control process parameters of pressure, a concentration of hydrogen ($H_2$) and a selected temperature between 650 and 800° C. In the illustrated example, the DCS flow rate was raised and lowered by 5% and 10% and demonstrated a low sensitivity on the thickness of the silicon epitaxial layer to the respective changes in DCS flow rate.

Figure 3C:
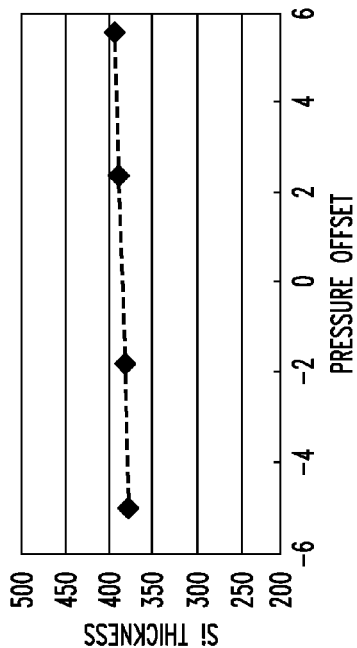
FIG. 3c is a plot showing the effect on the thickness of a silicon epitaxial layer deposited above a silicon germanium epitaxial layer on a substrate in a deposition reactor as a function of pressure.
Figure 3B:
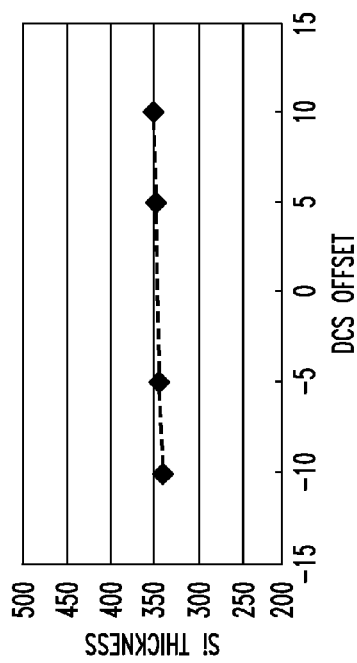
FIG. 3b is a plot showing the effect on the thickness of a silicon epitaxial layer deposited above a silicon germanium epitaxial layer on a substrate in a deposition reactor as a function of hydrogen (H2) flow rate.

FIG. 3b shows an example of the effect on the thickness of a silicon epitaxial layer deposited above a silicon germanium epitaxial layer on a substrate in a deposition reactor as a function of hydrogen ($H_2$) concentration. In FIG. 3b, the silicon epitaxial layer was deposited in the surface reaction controlled region using a CVD process including control process parameters of a pressure, flow rate of DCS and a selected temperature between 650 and 800° C. In the illustrated example, the $H_2$ concentration was raised and lowered by 5% and 10%, and demonstrated a low sensitivity on the thickness of the silicon epitaxial layer to the respective changes in $H_2$ concentration.

FIG. 3c is a plot illustrating an example of the effect on the thickness of a silicon epitaxial layer deposited above a silicon germanium epitaxial layer on a substrate in a deposition reactor as a function of pressure in the deposition reactor. In FIG. 3c, the silicon epitaxial layer was deposited in the surface reaction controlled region using a CVD process including control process parameters of hydrogen ($H_2$) concentration, a flow rate of DCS and a selected temperature between 650 and 800° C. In the illustrated example, the pressure was raised and lowered by 2 Torr and 4 Torr, and demonstrated a low sensitivity on the thickness of the silicon epitaxial layer to the respective changes in the pressure in the deposition reactor.

Figure 3D:
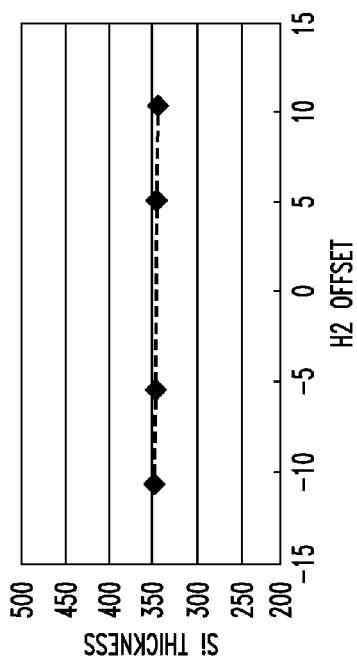
FIG. 3d is a plot showing the effect on the thickness of a silicon epitaxial layer deposited above a silicon germanium epitaxial layer on a substrate in a deposition reactor as a function of temperature.

FIG. 3d is a plot showing an example of the effect on the thickness of a silicon epitaxial layer deposited above a silicon germanium epitaxial layer on a substrate in a deposition reactor as a function of temperature (° C.). In FIG. 3d, the silicon epitaxial layer was deposited in the surface reaction controlled region using a CVD process including control process parameters of a pressure, a flow rate of DCS and a concentration of hydrogen ($H_2$). In the illustrated example, the temperature was raised and lowered by 5° C. and 10° C. from a selected temperature between 650 and 800° C., and demonstrated a high sensitivity on the thickness of the silicon epitaxial layer to the respective changes in temperature. As illustrated, precise temperature control is essential while depositing a silicon epitaxial layer using a CVD process in the surface reaction controlled region.

Figure 4:
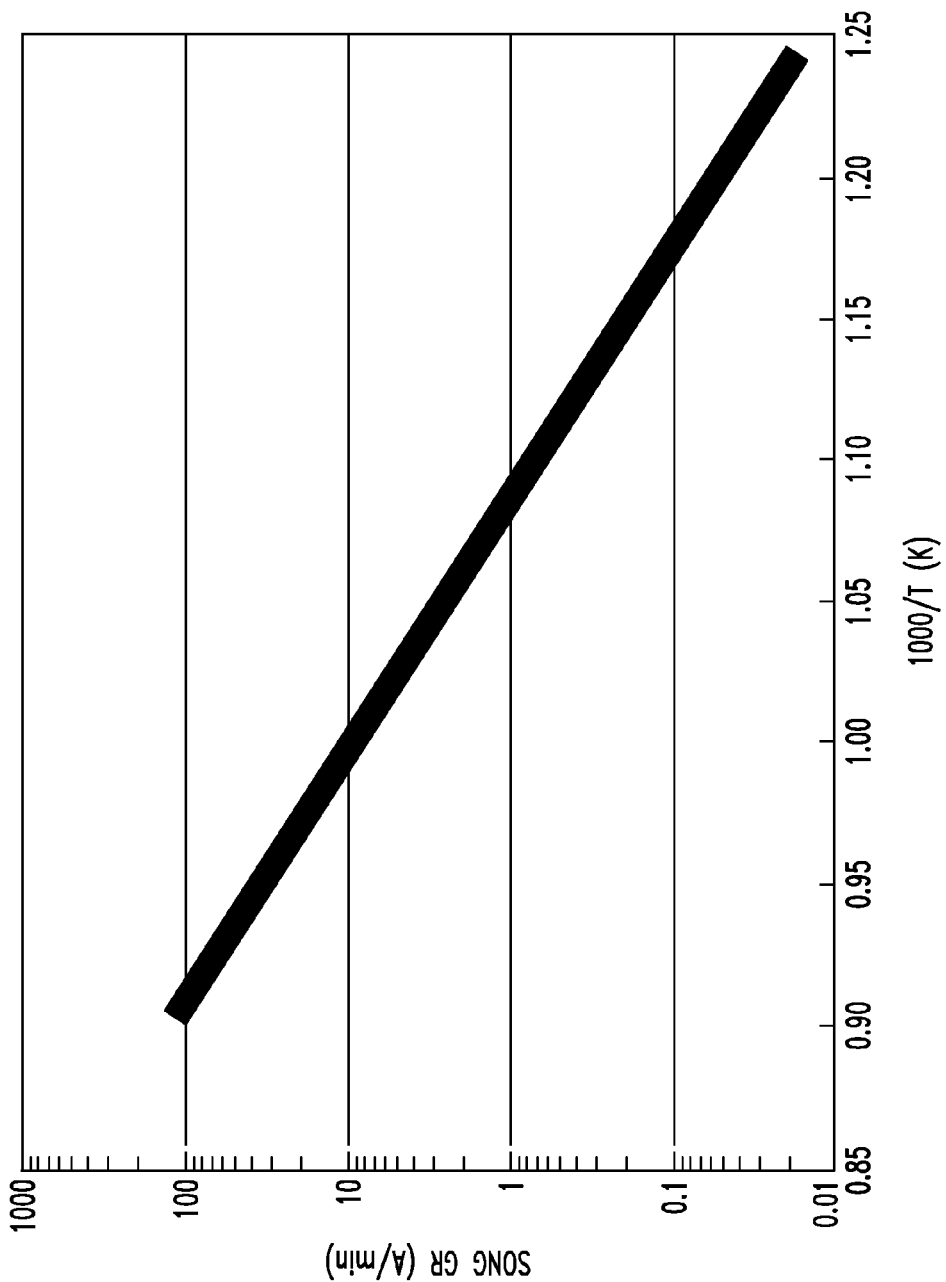
FIG. 4 is a plot showing the effect on the growth rate of a silicon epitaxial layer deposited above a silicon germanium epitaxial layer on a substrate as a function of temperature.

FIG. 4 shows a plot illustrating a nonlimiting example of the effect on the growth rate of a silicon epitaxial layer deposited above a silicon germanium epitaxial layer on a substrate as a function of temperature. As demonstrated in the present example, the growth rate, measured in Angstroms/minute (A/min), of a silicon epitaxial layer deposited on a silicon germanium epitaxial layer above a substrate (SONG) is highly sensitive to changes in temperature while operating in the surface reaction controlled region during a CVD process. For example, and as shown in FIG. 4, the growth rate increased substantially linearly with temperature. Additionally, the data had a high correlation coefficient or coefficient of determination ($R^2$) of approximately 0.9912. As illustrated, the growth rate of a silicon epitaxial layer deposited above a silicon germanium epitaxial layer on a substrate using a CVD process in the surface reaction controlled region can provide an accurate and precise index for monitoring a temperature in a deposition reactor. Thus, if the growth rate can be measured accurately, a temperature in the deposition reactor can be precisely determined, overcoming shortfalls in the conventional methods of temperature determination and calibration.

Figure 5:
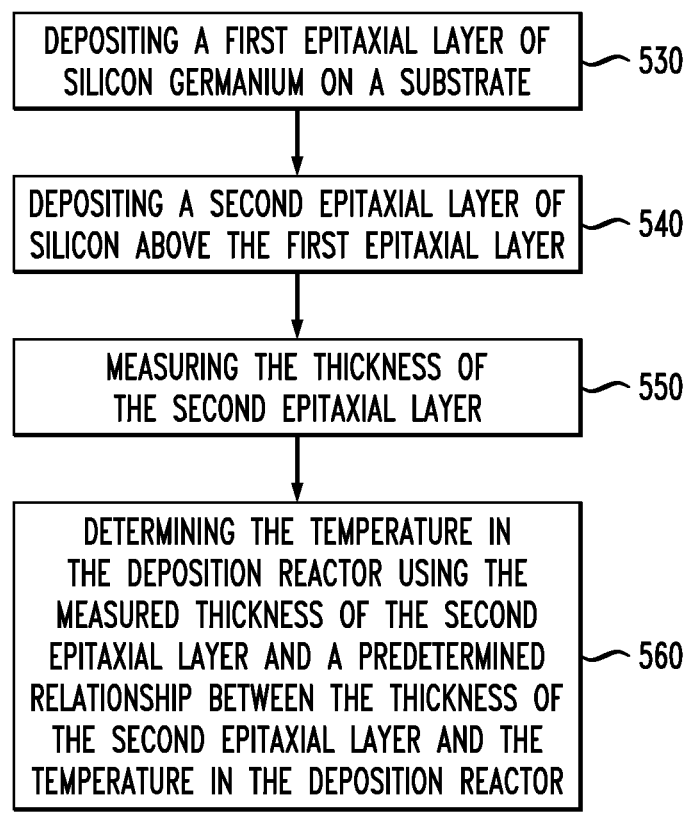
FIG. 5 is a flow chart illustrating a method of determining a temperature in a deposition reactor according to an embodiment of the present disclosure.

FIG. 5 is a flow chart illustrating a method of determining a temperature in a deposition reactor according to some embodiments. At block 530, a first epitaxial layer of silicon germanium is deposited on a substrate. In some embodiments, the substrate is a semiconductor wafer or die. In some embodiments, the substrate may be a p-type substrate. In another embodiment, the substrate may be an n-type substrate. The substrate may be formed from a material including, but not limited to, a Group IV elemental or compound semiconductor or a Group III-V semiconductor. The substrate may include silicon. The substrate may include another elementary semiconductor such as, for example, germanium. The substrate may also include a compound semiconductor such as, for example, silicon carbide, gallium arsenic, indium arsenide or indium phosphide. In some embodiments, the substrate is provided in a deposition reactor. In a preferred embodiment, the substrate is a blank silicon wafer. In alternative embodiments (not shown), one or more intervening layers are provided between the bulk substrate and the first epitaxial layer.

In some embodiments, the blank wafer is not pre-processed prior to being provided in a deposition reactor. In another embodiment, the substrate may undergo pre-clean process steps including, but not limited to, an etch, oxygen ($O_2$) strip, RCA clean or combinations thereof. The deposition reactor may be a hot wall reactor or a cold wall reactor. The first epitaxial layer may be deposited by any suitable method. In a preferred embodiment, the first epitaxial layer is deposited using a thermal CVD process. In some embodiments, the first epitaxial layer is deposited using vapor phase epitaxy. In another embodiment the first epitaxial layer is deposited using liquid phase epitaxy or molecular beam epitaxy. In some embodiments, the precursors introduced into the deposition reactor to grow the first epitaxial layer may include, but are not limited to, germane ($GeH_4$), monosilane ($SiH_4$), dichlorosilane ($H_2SiCl_2$ or DCS), trichlorosilane ($SiHCl_3$), silicon tetrachloride ($SiCl_4$), hydrogen chloride (HCl), hydrogen ($H_2$), or combinations thereof. In some embodiments, the first epitaxial layer may be a relaxed silicon germanium epitaxial layer.

At block 540, a second epitaxial layer of silicon is deposited above the first epitaxial layer. For example, a silicon (second) epitaxial layer may be deposited directly on a SiGe (first) epitaxial layer. The second epitaxial layer may be deposited by any suitable method. In a preferred embodiment, the second epitaxial layer is deposited using a thermal CVD process. In some embodiments, the precursors introduced into the deposition reactor to grow the second epitaxial layer may include, but are not limited to, monosilane ($SiH_4$), dichlorosilane ($H_2SiCl_2$ or DCS), trichlorosilane ($SiHCl_3$), silicon tetrachloride ($SiCl_4$), hydrogen chloride (HCl), hydrogen ($H_2$), or combinations thereof. In a preferred embodiment, the second epitaxial layer is deposited directly on the first epitaxial layer. The step of depositing the second epitaxial layer on the first epitaxial layer may introduce a bi-axial tensile strain in a silicon channel. In another embodiment, the second epitaxial layer is deposited on an intervening epitaxial layer deposited on the first epitaxial layer. The preferred method involves establishing process conditions in the deposition reactor such that the step illustrated at block 540 is surface reaction controlled. In some embodiments, the deposition reactor may be heated to approximately a predetermined temperature. In an embodiment, the predetermined temperature is within a range where the Si epitaxial layer thickness is temperature sensitive, such as from approximately 500° C. to approximately 900° C. In some embodiments using a hot wall reactor, the step of heating may be accomplished by any suitable method such as, for example, resistive heating, RF induction heating or radiant heating. In some embodiments using a cold wall reactor, the step of heating may include heating the substrate and may be accomplished by any suitable method such as, for example, induction or radiant heating. In some embodiments, the heat output of a heating device, such as, for example, a radiant heat lamp, a reflective surface, a resistive heating element, an RF induction heating element with a conductive susceptor, an induction furnace, or the like may be measured using a temperature measuring device. The temperature measuring device may be any suitable device to measure a temperature in the deposition reactor. For example, the temperature measuring device may be a temperature sensor, a thermocouple, a pyrometer, a thermistor, a resistance temperature detector (RTD), a platinum resistance thermometer (PRT), or the like.

At block 550, the thickness of the second epitaxial layer is measured. The second epitaxial layer thickness may be measured by any suitable method. For example, the second epitaxial layer thickness may be measured using X-ray reflectometry (XRR). X-rays may be introduced into the deposition reactor and reflected from each surface/interface of the first epitaxial layer, second epitaxial layer and substrate where an electron density changes. The reflections from several interfaces may lead to a fringe pattern due to phase shift and interference. The phase shift and interference may allow for measurement of the thickness of the second epitaxial layer. In some embodiments using XRR, the thickness measurement is performed at a glancing angle with the specular reflection of the X-rays being detected by a detector, the intensity recorded as a function of an angle of incidence, and the fringe period measured relating to the thickness of the second epitaxial layer. In another embodiment, a material density of the second epitaxial layer may be measured using XRR. In some embodiments, the second epitaxial layer thickness may be measured using XRR and X-ray fluorescence (XRF). In another embodiment, the thickness of the second epitaxial layer is measured using X-ray diffraction (XRD). The second epitaxial layer thickness may also be measured using ellipsometry where light reflection at the interface between the first epitaxial layer and second epitaxial layer is dependent upon the polarization of the light emitted toward the layered substrate. Each of the thickness measurement methods are known in the art as highly accurate methods. For example, XRR is understood as being capable of providing an accurate measurement from approximately a few atomic layers to 1 micron of material and can be performed rapidly, e.g. within seconds. Also by way of example, ellipsometry is understood as a method capable of providing an accurate thickness measurement from approximately 1 nm to several microns At block 560, a temperature in the deposition reactor may be determined using the measured thickness of the second epitaxial layer and a predetermined relationship between the thickness of the second epitaxial layer and the temperature in the deposition reactor, taking advantage of the temperature sensitivity of the growth rate of the second epitaxial layer of silicon described above. In some embodiments, the growth rate of the second epitaxial layer is surface reaction controlled. As discussed above, in a surface reaction controlled deposition process, the surface reaction rate constant ($k_s$) is relatively small and highly temperature dependent. The growth of the second epitaxial layer is controlled by processes at the deposited surface, including adsorption, decomposition, surface migration, chemical reaction and desorption of products. Thus, and as discussed above, the growth rate and the thickness of a silicon epitaxial layer deposited above a silicon germanium epitaxial layer is highly sensitive to changes in temperature while operating in the surface reaction controlled region during a CVD process.

As illustrated in FIGS. 3a-3d and FIG. 4, a change in a temperature in a deposition reactor results in a change in the growth rate and thickness of the silicon epitaxial layer. Therefore, measuring a thickness of the second epitaxial layer of silicon makes it possible to determine a difference between an actual temperature in a deposition reactor and a predetermined temperature, such as, for example, a setpoint temperature targeted in the deposition reactor, while operating in a surface reaction controlled region. In particular, the thickness of a deposited silicon epitaxial layer can be used to determine the actual temperature in the deposition reactor, for example, based on an empirically derived model or based on an initially calibrated model. In other words, if an empirical model, or an initially calibrated model, indicates that a predetermined temperature (e.g. a targeted setpoint temperature) should produce an expected silicon epitaxial layer thickness and a measured silicon epitaxial layer thickness is different than the expected thickness, than it can be concluded that the actual temperature is different than the predetermined temperature. As discussed above, a possible cause includes a temperature measuring device that is inaccurately reporting the temperature. Alternatively, as described above, other possible causes include a degradation in a heating device performance or power output. For example, a heating lamp performance or power output may be degraded over time, a reflective surface surrounding the deposition reactor may degrade over time, or material deposits may build up in the deposition reactor, such as at a susceptor element. Although the actual temperature approximates the predetermined (setpoint) temperature, any of the above conditions may cause the actual temperature to differ from the setpoint temperature.

In some embodiments, a temperature measuring device may be adjusted or tuned, based on the difference between the predetermined thickness of the silicon epitaxial layer and the measured thickness of the silicon epitaxial layer. In some embodiments, a temperature measuring device may be adjusted or tuned automatically using, for example, a computer-implemented calibration system based on the measured difference between the silicon epitaxial layers. Embodiments of the present disclosure include methods for calibrating a temperature measuring device in a deposition reactor and methods for deposition reactor matching based on comparisons between an expected or predetermined silicon epitaxial layer thickness and a measured silicon epitaxial layer thickness deposited in the surface reaction controlled region. Some embodiments make it possible to quickly and precisely determine, calibrate or match a deposition reactor's temperature, and overcome the known deficiencies in the conventional methods. This method also provides for more efficient and reliable consistent device fabrication and dramatically improve the volume production for N40, N28 and even smaller technology nodes.

Figure 6:
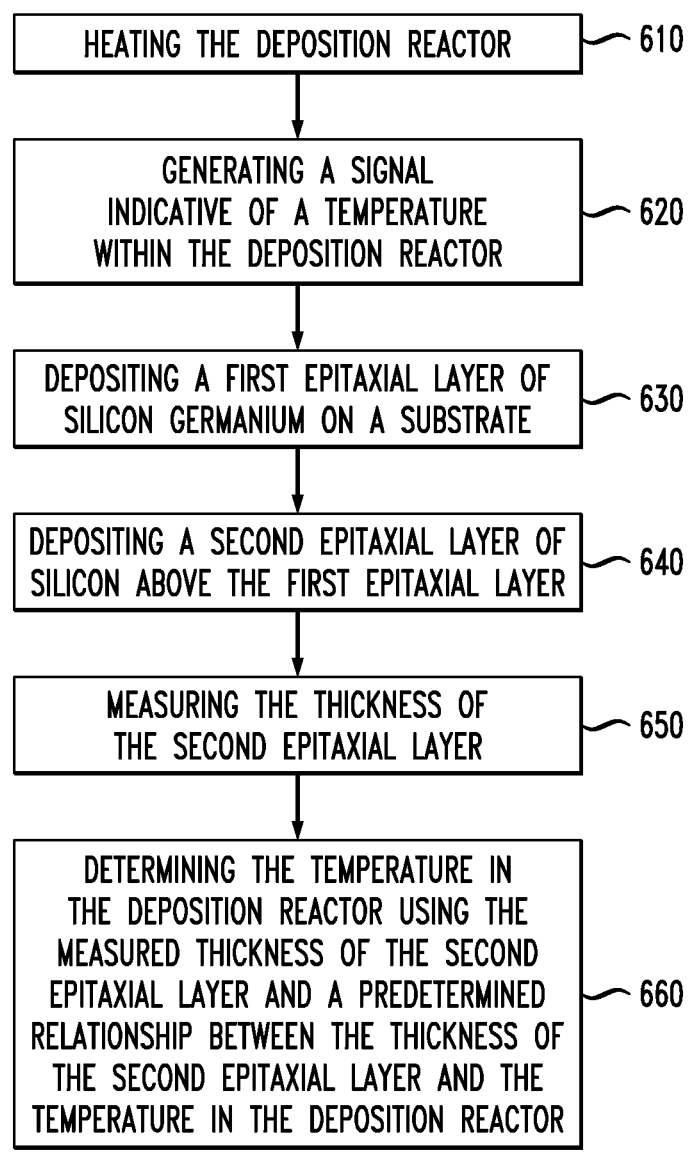
FIG. 6 is a flow chart illustrating a method of determining a temperature in a deposition reactor according to an embodiment of the present invention.

FIG. 6 is a flow chart illustrating a method of determining a temperature in a deposition reactor according to some embodiments of the present disclosure. At block 610, a deposition reactor is heated. For example, the deposition reactor may be a thermal CVD reactor such as a hot wall CVD reactor or a cold wall CVD reactor. The preferred method involves establishing process conditions in the deposition reactor such that the step described below and illustrated at block 640 is surface reaction controlled. In some embodiments, the deposition reactor may be heated to approximately a predetermined temperature. In an embodiment, the predetermined temperature is in a temperature from approximately 500° C. to approximately 900° C. (i.e., a temperature within the range at which the epitaxial Si layer thickness is sensitive only to temperature). The step of heating may be accomplished by any suitable method and as described above with reference to FIG. 5.

At block 620, a signal indicative of a temperature within the deposition reactor may be generated. In some embodiments, the heat output of a heating device, may be measured using a temperature measuring device. A temperature measuring device may be any device known in the art to measure a temperature in the deposition reactor. For example, a temperature measuring device may be a temperature sensor, a thermocouple, a pyrometer, a thermistor, a resistance temperature detector (RTD), a platinum resistance thermometer (PRT), or the like. In some embodiments, a temperature measuring device, such as a thermocouple, may be positioned at a location in the deposition reactor for measuring a temperature at the center of the substrate, and one or more temperature measuring devices may be positioned for measuring the temperature at one or more edges of the substrate. It will be appreciated that one or more of such temperature measuring devices can be configured to measure a temperature at alternative and/or additional locations in the deposition reactor. A temperature measuring device may generate a signal indicative of the measured temperature as is known in the art. In some embodiments, the deposition reactor may be heated to approximately the predetermined temperature using the steps outlined in steps 610 and 620. For example, the deposition reactor may be heated to approximately the predetermined temperature using a heating device and a temperature measuring device. In an embodiment, the predetermined temperature is within a range where the Si epitaxial layer thickness is temperature sensitive, from approximately 500° C. to approximately 900° C.

At block 630, a first epitaxial layer of silicon germanium is deposited on a substrate provided in the heated deposition reactor. As discussed above with reference to FIG. 5, in various embodiments, the substrate may be any suitable substrate. In a preferred embodiment, the substrate include silicon and may include another elementary semiconductor or a compound semiconductor as discussed above with reference to FIG. 5. In a preferred embodiment, the substrate is a blank silicon wafer and is not pre-processed prior to being provided in a deposition reactor. The first epitaxial layer may be deposited by any suitable method and as provided above with reference to the description of FIG. 5.

At block 640, a second epitaxial layer of silicon is deposited above the first epitaxial layer. The second epitaxial layer may be deposited by any suitable method and as described above with reference to FIG. 5. The preferred method involves establishing process conditions, as discussed above, in the deposition reactor such that the step illustrated at block 640 is surface reaction controlled. At block 650, the thickness of the second epitaxial layer is measured. The second epitaxial layer thickness may be measured by any suitable method including, but not limited to XRR, XRR and XRF, XRD, ellipsometry or combinations thereof. At block 660, a temperature in the deposition reactor may be determined using the measured thickness of the second epitaxial layer and a predetermined relationship between the thickness of the second epitaxial layer and the temperature in the deposition reactor. As discussed above, measuring a thickness of the second epitaxial layer of silicon makes it possible to determine a difference between an actual temperature in a deposition reactor and a predetermined temperature, such as, for example, a setpoint temperature targeted in the deposition reactor, while operating in a surface reaction controlled region. Additionally, as described above, the measured thickness of a deposited silicon epitaxial layer can be used to determine the actual temperature in the deposition reactor, for example, based on an empirically derived model or based on an initially calibrated model.

Figure 7:
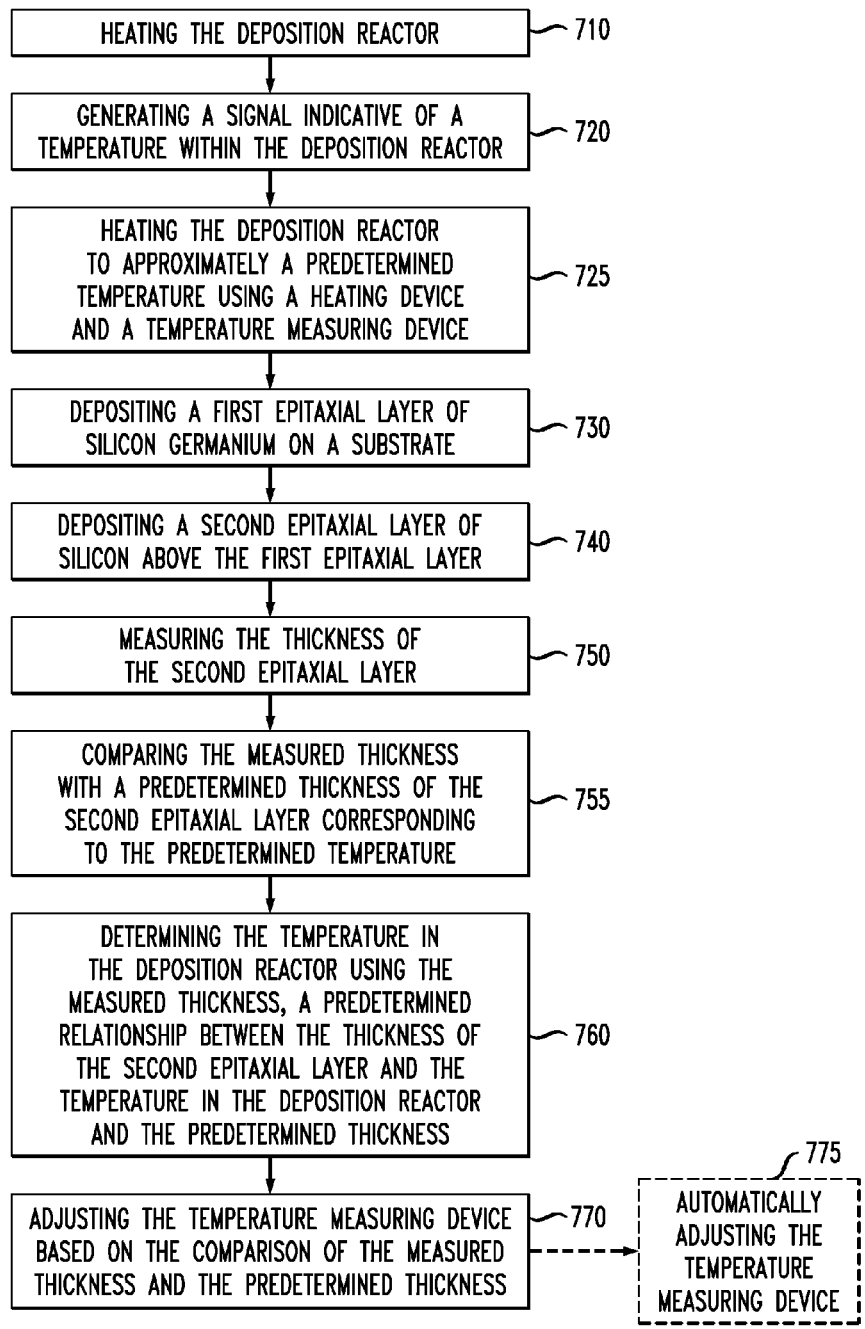
FIG. 7 is a flow chart illustrating a method of determining a temperature in a deposition reactor according to an embodiment of the present invention.

With reference to FIG. 7, a flow chart illustrating a method of determining a temperature in a deposition reactor according to some embodiments is provided. At block 710, a deposition reactor is heated by any suitable method and as described above with reference to FIG. 5. In some embodiments, the deposition reactor may be heated to approximately a predetermined temperature. In an embodiment, the predetermined temperature is in a range where the Si epitaxial layer thickness is temperature sensitive, such as from approximately 500° C. to approximately 900° C.

At block 720, a signal indicative of a temperature within the deposition reactor may be generated. In some embodiments, the heat output of a heating device, may be measured using a temperature measuring device. A temperature measuring device may be any device suitable to measure a temperature in the deposition reactor. As described above, a temperature measuring device may be positioned and/or configured to measure a temperature at a predetermined location in the deposition reactor and generate a signal indicative of the measured temperature. At block 725, the deposition reactor may be heated to approximately a predetermined temperature using the steps outlined in steps 710 and 720 and using a heating device and a temperature measuring device.

At block 730, a first epitaxial layer of silicon germanium is deposited on a substrate provided in the heated deposition reactor. As discussed above, in various embodiments, the substrate may be any substrate as is known in the art and used in CVD processes. In a preferred embodiment, the substrate is not pre-processed prior to being provided in a deposition reactor. The first epitaxial layer may be deposited by any suitable method and as described above, such as a thermal CVD process. At block 740, a second epitaxial layer of silicon is deposited above the first epitaxial layer. The second epitaxial layer may be deposited by any suitable method, such as, a thermal CVD process. In a preferred embodiment, the second epitaxial layer is deposited on the first epitaxial layer. The preferred method involves establishing process conditions, as discussed above, in the deposition reactor such that the step illustrated at block 740 is surface reaction controlled.

At block 750, the thickness of the second epitaxial layer is measured. The second epitaxial layer thickness may be measured by any suitable method including, but not limited to XRR, XRR and XRF, XRD, ellipsometry or combinations thereof. At block 760, the measured thickness of the second epitaxial layer is compared to a predetermined thickness of the second epitaxial layer corresponding to the predetermined temperature. For example, the measured thickness of the second epitaxial layer may be compared to a thickness of an epitaxial layer of silicon, deposited on an epitaxial layer of silicon germanium deposited on a substrate during the formation of an empirically derived model or an initially calibrated model, corresponding to the predetermined temperature and determined prior to depositing the second epitaxial layer.

At block 760, a temperature in the deposition reactor may be determined using the measured thickness of the second epitaxial layer, a predetermined relationship between the thickness of the second epitaxial layer and the temperature in the deposition reactor, and the predetermined thickness of the second epitaxial layer. In some embodiments, if an empirical model, or an initially calibrated model, indicates that the predetermined temperature (e.g. a targeted setpoint temperature) should produce a predetermined second epitaxial layer thickness and the measured second epitaxial layer thickness is different from the predetermined thickness, then it can be concluded that the actual temperature in the deposition reactor is different from the predetermined temperature. As discussed above, measuring a thickness of the second epitaxial layer of silicon makes it possible to determine a difference between an actual temperature in a deposition reactor and the predetermined temperature, such as, for example, a setpoint temperature targeted in the deposition reactor, while operating in a surface reaction controlled region. For example, an initially calibrated model for a deposition reactor may provide a plot of predetermined thicknesses of a silicon epitaxial layer deposited above a silicon germanium epitaxial layer on a substrate in a deposition reactor as a function of temperature (° C.). In the present example, if the measured thickness at the actual temperature is compared to the predetermined thickness at the predetermined temperature, and the thicknesses are different, by correlating the measured thickness to an equivalent thickness on the plot of the initially calibrated model, the actual temperature in the deposition reactor may be determined.

At block 770, a temperature measuring device may be adjusted or tuned, based on the comparison between the predetermined thickness of the silicon epitaxial layer and the measured thickness of the silicon epitaxial layer. In some embodiments, and as shown at block 775, a temperature measuring device may be adjusted or tuned automatically using, for example, a computer-implemented calibration system based on the comparison between the thicknesses of the second epitaxial layers.

Figure 8:
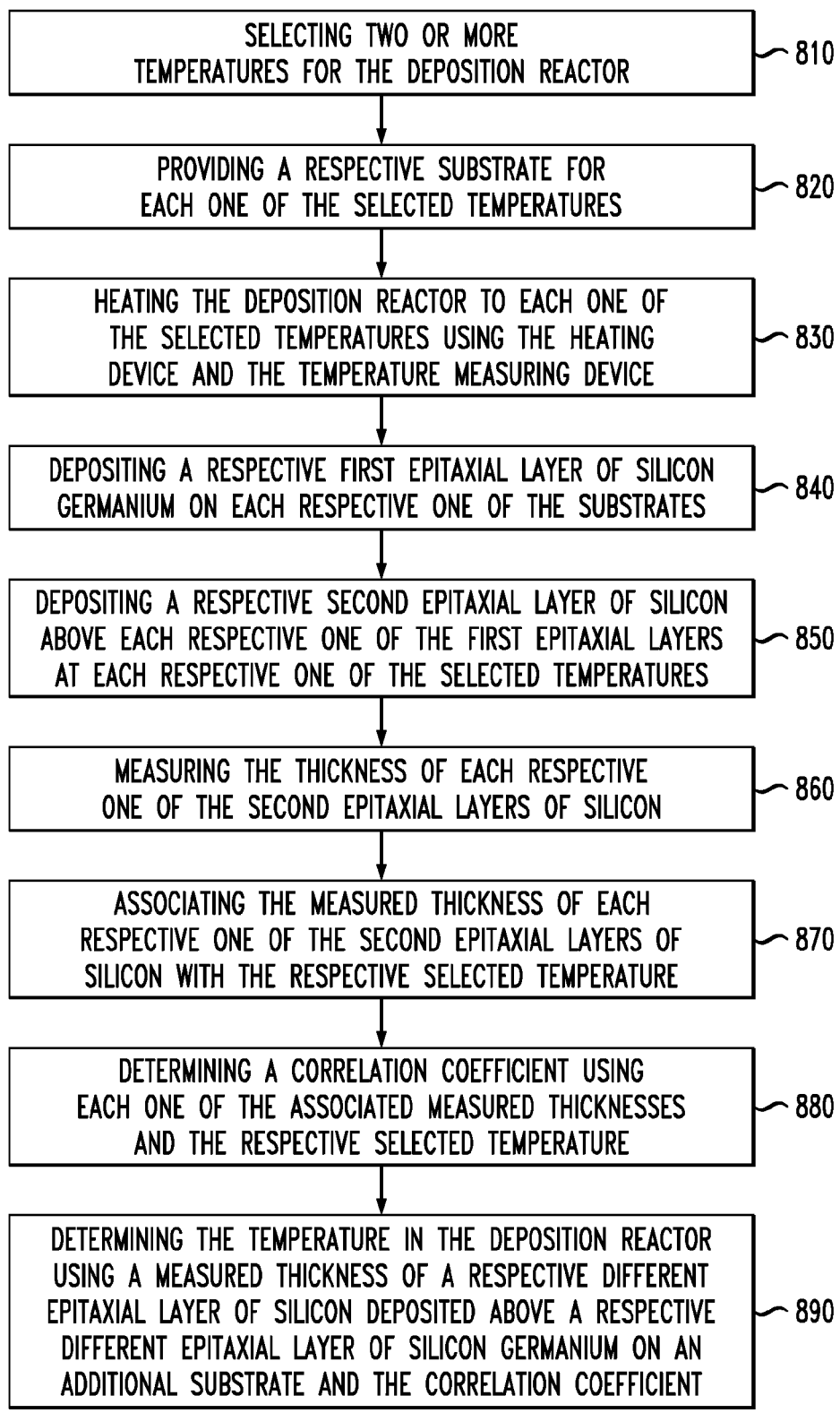
FIG. 8 is a flow chart illustrating a method of determining a temperature in a deposition reactor according to an embodiment of the present disclosure.

With reference now to FIG. 8, a flow chart illustrating a method of determining a temperature in a deposition reactor according to some embodiments of the present disclosure is provided. At block 810, two or more temperatures are selected for a deposition reactor. The temperatures are selected to establish process conditions in the deposition reactor such that the step of depositing a silicon epitaxial layer is within the surface reaction controlled region. In an embodiment, each one of the selected temperatures are within a range where the Si epitaxial layer thickness is temperature sensitive, such as from approximately 500° C. to approximately 900° C. In a preferred embodiment, the range between each one of the selected temperatures is approximately 10° C. For example, each one of the selected temperatures may be between approximately 520° C. and approximately 530° C., or approximately 600° C. and approximately 610° C. or approximately 750° C. and approximately 760° C.

At block 820, a respective substrate is provided for each one of the selected temperatures in a deposition reactor. As discussed above, in various embodiments, each one of the respective substrates may be any substrate as is known in the art and used in CVD processes. In some embodiments, each one of the respective substrates is not pre-processed prior to being provided in a deposition reactor. In another embodiment, each one of the respective substrates may undergo pre-clean process steps including, but not limited to, an etch, oxygen ($O_2$) strip, RCA clean or combinations thereof.

At block 830, the deposition reactor is heated to each one of the selected temperatures by any suitable method, and as described above, using a heating device and a temperature measuring device. At block 840, a respective first epitaxial layer of silicon germanium is deposited on each respective one of the substrates using, for example, a thermal CVD process. At block 850, a respective second epitaxial layer of silicon is deposited above each respective one of the first epitaxial layers of silicon germanium using, for example, a thermal CVD process. In a preferred embodiment, each respective one of the second epitaxial layers of silicon is deposited directly on each respective one of the first epitaxial layers of silicon germanium.

At block 860, the thickness of each respective one of the second epitaxial layers of silicon is measured by any suitable method including, but not limited to XRR, XRR and XRF, XRD, ellipsometry or combinations thereof. At block 870, the measured thickness of each respective one of second epitaxial layers of silicon is associated with the respective selected temperature. In some embodiments, a plot including the measured thickness of each respective one of second epitaxial layers of silicon as a function of the respective selected temperature (° C.) may be generated. For example, a plot as illustrated in FIG. 3d may be calculated and including the measured thickness of each respective one of second epitaxial layers of silicon as a function of the respective selected temperature (° C.). At block 880, a correlation coefficient is determined using each one of the associated measured thicknesses and the respective selected temperature. For example, a correlation coefficient may be calculated for a plot including the measured thickness of each respective one of second epitaxial layers of silicon as a function of the respective selected temperature (° C.).

At block 890, a temperature in the deposition reactor is determined using the correlation coefficient and a measured thickness of a respective different epitaxial layer of silicon deposited above a respective different epitaxial layer of silicon germanium on an additional substrate. For example, following the determination of the correlation coefficient for the data including each one of the associated measured thicknesses and the respective selected temperature, an additional substrate is provided in the deposition reactor. In the present example, each one of the selected temperatures was between approximately 500° C. and approximately 900° C. As discussed above, the deposition reactor, having the additional substrate provided therein, is heated to approximately a desired predetermined temperature using the heating device and the temperature measuring device. Assume for example, that a setpoint temperature of T° C. is selected. As described above, a respective different epitaxial layer of silicon germanium is deposited on the additional substrate and a respective different epitaxial layer of silicon is deposited on the respective different epitaxial layer of silicon germanium. The thickness of the deposited respective different epitaxial layer of silicon is measured as discussed above. Using the correlation coefficient, a predetermined thickness is determined for the respective different epitaxial layer of silicon at T+2° C. In the present example, if the measured thickness at approximately T+2° C. calculated using the temperature measuring device is compared to the predetermined thickness at T+2° C., and the thicknesses are different, the actual temperature in the deposition reactor is likely not T+2° C. The actual temperature in the deposition reactor may be determined using the correlation coefficient and by correlating the measured thickness to the equivalent thickness on the calculated plot including the measured thickness of each respective one of second epitaxial layers of silicon as a function of the respective selected temperature (° C.). The actual temperature in the deposition reactor may be determined as the temperature corresponding to the equivalent thickness on the calculated plot.

Figure 9:
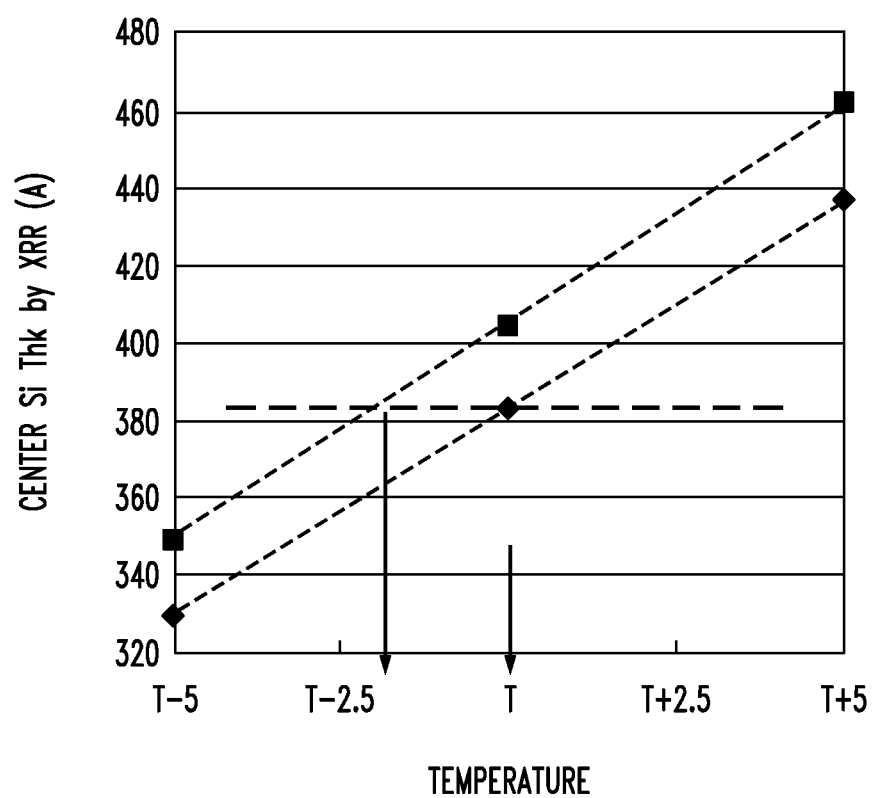
FIG. 9 is a plot showing a nonlimiting example of determining a temperature in a deposition reactor according to an embodiment of the present invention.

FIG. 9 is a nonlimiting example of determining a temperature in a deposition reactor according to some embodiments of the present invention. Various temperatures are selected between T and T+/−5° C. where T is a temperature in a range where the Si epitaxial layer thickness is temperature sensitive, such as, for example, a temperature between 650 and 800° C. A deposition reactor is heated to each one of the respective selected temperatures, using a heating device and a temperature monitoring device, and a silicon epitaxial layer is deposited above a silicon germanium epitaxial layer on a substrate in the deposition reactor at each one of the respective selected temperatures. A thickness of each respective one of the silicon epitaxial layers is measured using XRR. A plot 930 is generated including the measured thickness of each respective one of the silicon epitaxial layers as a function of the respective selected temperature (° C.). A correlation coefficient is calculated for the plot 930. The deposition reactor is subsequently heated to approximately T° C. using the heating device and the temperature monitoring device. A respective different silicon epitaxial layer is deposited above a respective different silicon germanium epitaxial layer on an additional substrate in the deposition reactor at approximately T° C. A thickness of the respective different silicon epitaxial layer is measured using XRR, shown along plot 940, and compared to the predetermined thickness at T° C. for plot 930. As illustrated, the measured thickness of the respective different silicon epitaxial layer (plot 940) is calculated as smaller than the predetermined thickness at T° C. (plot 930). Thus, the actual temperature in the deposition reactor is determined to be less than that indicated on the temperature measuring device. In the present example, the actual temperature in the deposition reactor was determined to be approximately T−1.75° C.

Figure 10:
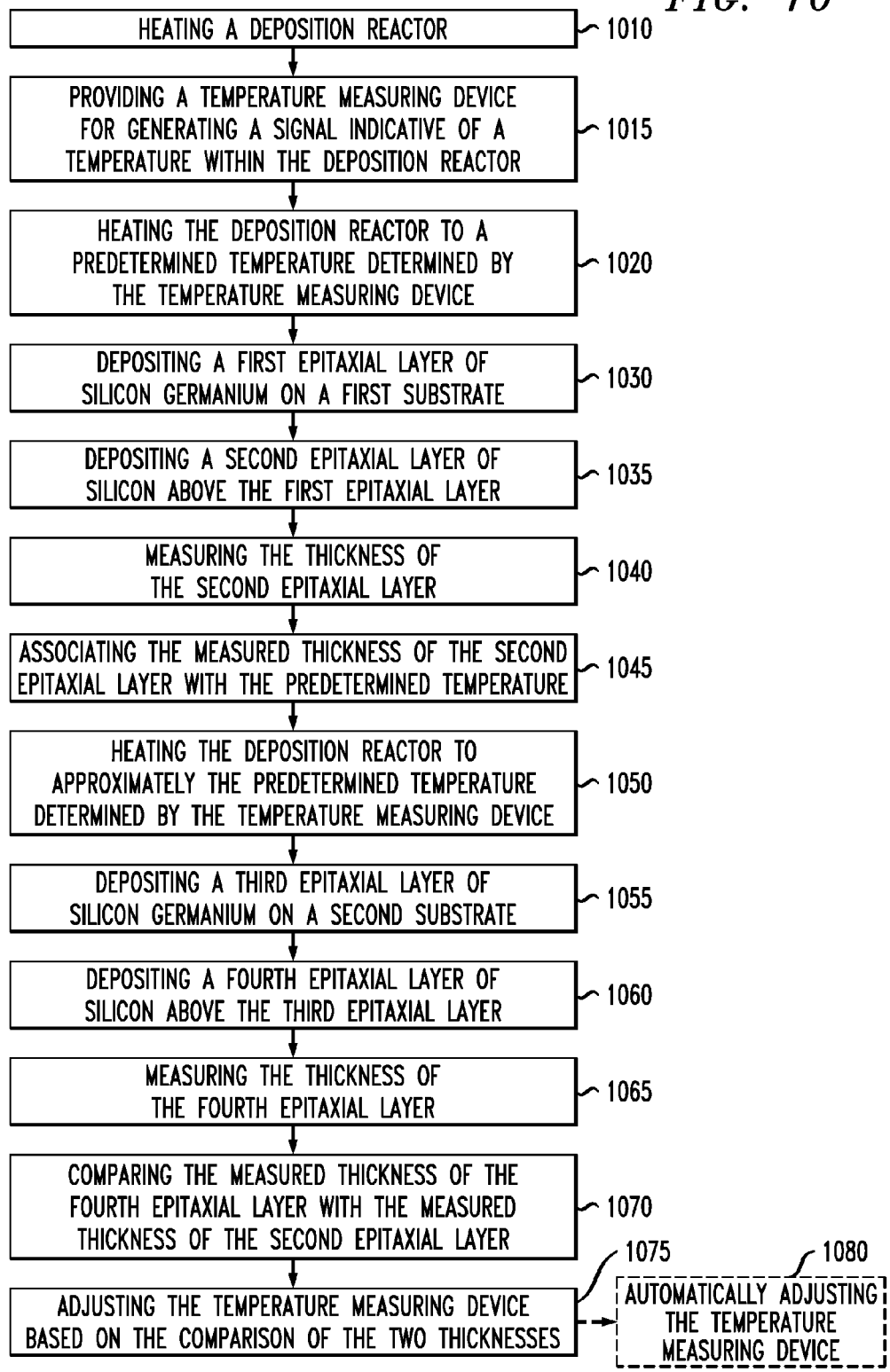
FIG. 10 is a flow chart illustrating a method according to an embodiment of the present disclosure.

FIG. 10 shows a method of determining a temperature in a deposition reactor. At block 1010, a deposition reactor is heated. At block 1015, a temperature measuring device is provided for generating a signal indicative of a temperature at a predetermined location within the deposition reactor. In some embodiments, the heat output of a heating device may be measured using the temperature measuring device.

At block 1020, the deposition reactor may be heated to a predetermined temperature determined using the temperature measuring device. In an embodiment, the predetermined temperature is approximately 500° C. to approximately 900° C. At block 1030, a first epitaxial layer of silicon germanium is deposited on a first substrate provided in the heated deposition reactor. At block 1035, a second epitaxial layer of silicon is deposited above the first epitaxial layer. The preferred method involves establishing process conditions, as discussed above, in the deposition reactor such that the step illustrated at block 1035 is surface reaction controlled.

At block 1040, the thickness of the second epitaxial layer is measured by XRR, XRR and XRF, XRD, ellipsometry or the like, or combinations thereof. At block 1045, the measured thickness of the second epitaxial layer is associated with the predetermined temperature. At block 1050, the deposition reactor is heated to approximately the predetermined temperature using the temperature measuring device. At block 1055, a third epitaxial layer of silicon germanium is deposited on a second substrate provided in the heated deposition reactor. At block 1060, a fourth epitaxial layer of silicon is deposited above the third epitaxial layer. In a preferred embodiment, the fourth epitaxial layer is deposited on the third epitaxial layer. The preferred method involves establishing process conditions, as discussed above, in the deposition reactor such that the step illustrated at block 1060 is surface reaction controlled. At block 1065, the thickness of the fourth epitaxial layer is measured.

At block 1070, the measured thickness of the fourth epitaxial layer is compared to the measured thickness of the second epitaxial layer. In some embodiments, a temperature in the deposition reactor may be determined using the measured thickness of the second epitaxial layer and the measured thickness of the fourth epitaxial layer. At block 1075, a temperature measuring device may be adjusted or tuned, based on the comparison between the measured thickness of the second epitaxial layer and the measured thickness of the fourth epitaxial layer. In some embodiments, and as shown at block 1080, the temperature measuring device may be adjusted or tuned automatically using, for example, a computer-implemented calibration system based on the comparison between the thicknesses of the second epitaxial layers.

Figure 11:
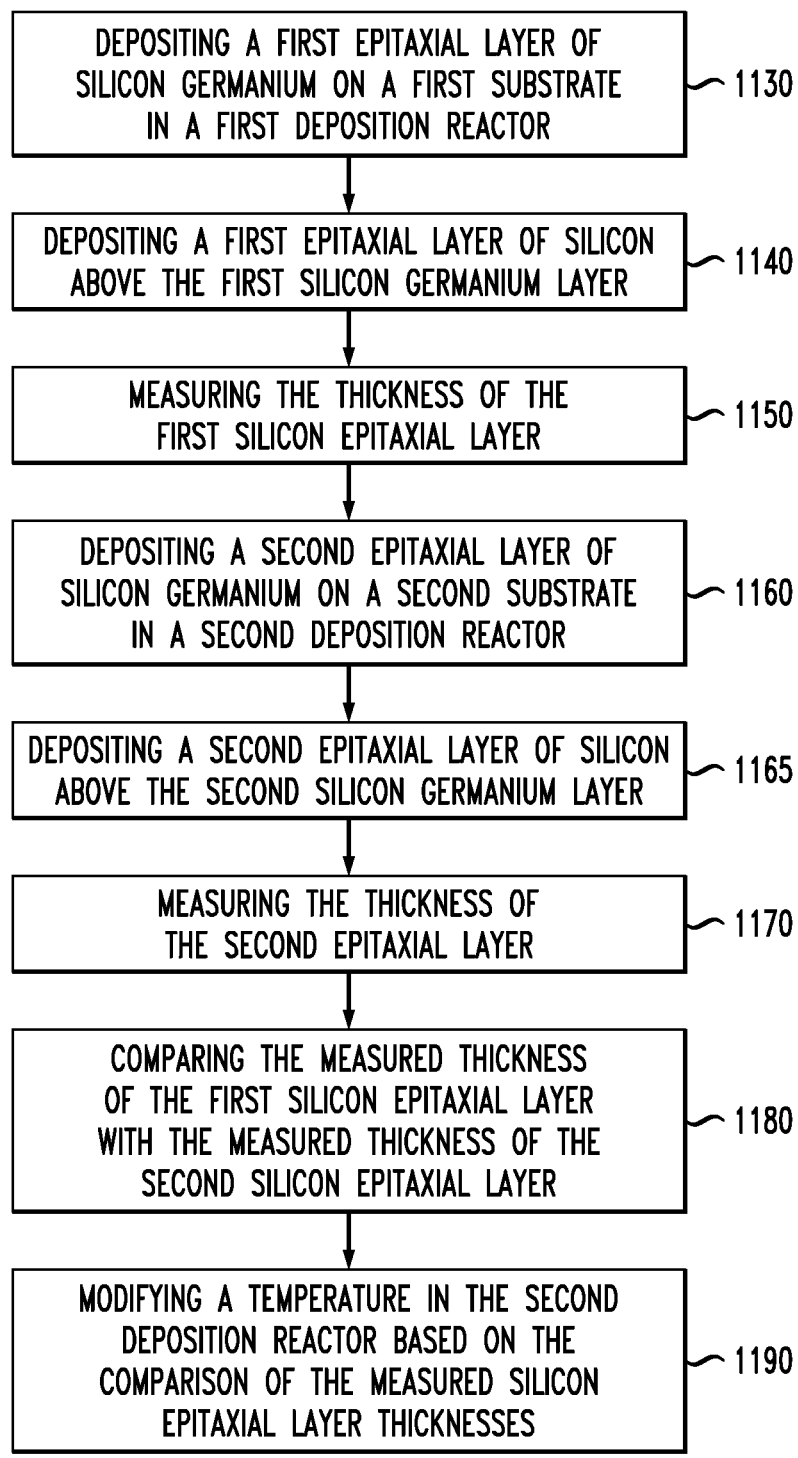
FIG. 11 is a flow chart illustrating a method according to an embodiment of the present disclosure.

FIG. 11 provides a flow chart illustrating a reactor method. At block 1130, a first epitaxial layer of silicon germanium is deposited on a first substrate in a first deposition reactor. At block 1140, a first epitaxial layer of silicon is deposited above the first epitaxial layer of silicon germanium. In a preferred embodiment, the first silicon epitaxial layer is deposited on the first silicon germanium epitaxial layer. The process conditions are set such that the step illustrated at block 1140 is surface reaction controlled. The first deposition reactor may be heated to approximately a predetermined temperature within the temperature sensitive range of the deposited epitaxial layer. In an embodiment, the predetermined temperature is approximately 500° C. to approximately 900° C.

At block 1150, the thickness of the first silicon epitaxial layer is measured. At block 1160, a second epitaxial layer of silicon germanium is deposited on a second substrate provided in a second deposition reactor. At block 1165, a second epitaxial layer of silicon is deposited above the second silicon germanium epitaxial layer. The preferred method involves establishing process conditions approximately equivalent to the process conditions established in the first deposition reactor, as discussed above, in the second deposition reactor such that the step illustrated at block 1165 is surface reaction controlled. At block 1170, the thickness of the second silicon epitaxial layer is measured.

At block 1180, the measured thickness of the second silicon epitaxial layer is compared to the measured thickness of the first silicon epitaxial layer. In some embodiments, a temperature in the second deposition reactor may be determined using the measured thickness of the second silicon epitaxial layer and the measured thickness of the first silicon epitaxial layer. At block 1190, a temperature in the second deposition reactor may be modified based on the comparison between the measured silicon epitaxial layer thicknesses as described above. Some embodiments provide methods for deposition reactor matching based on comparisons between the measured silicon epitaxial layer thicknesses deposited in the surface reaction controlled region, to quickly and precisely determine, calibrate and/or match a deposition reactor's temperature.

Figure 12:
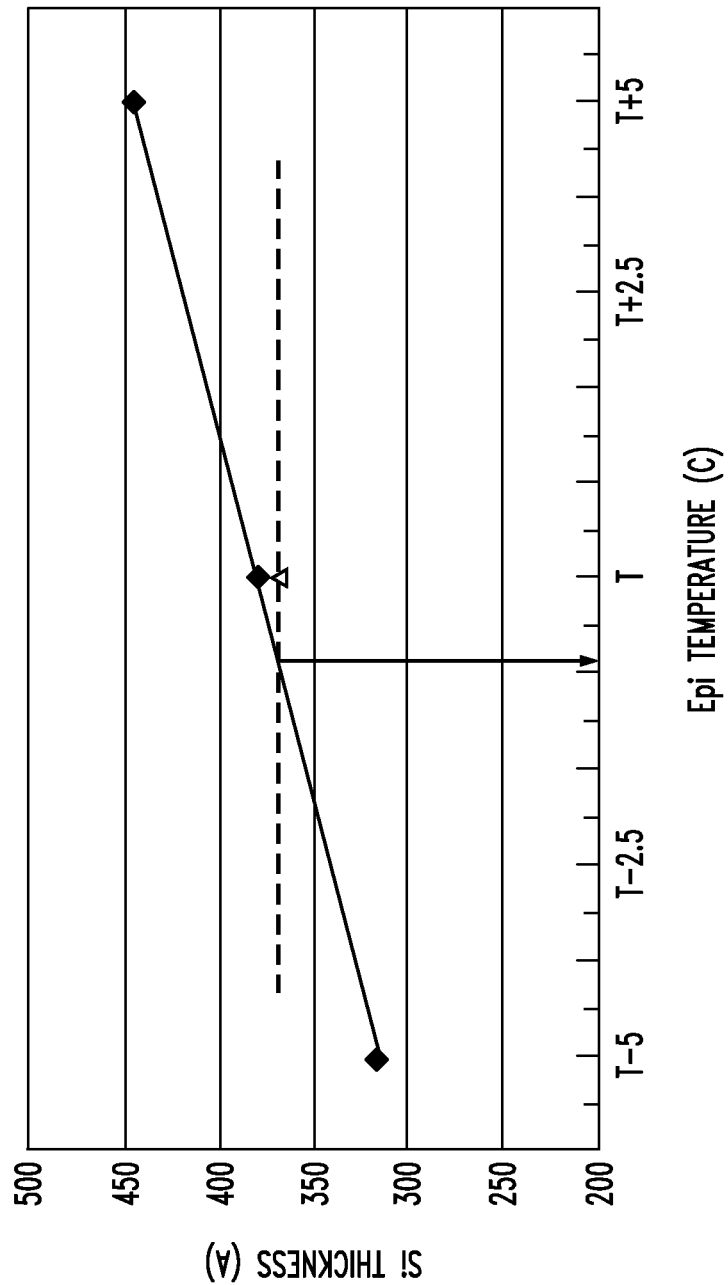
FIG. 12 is a plot showing a nonlimiting example of determining a temperature in a deposition reactor according to an embodiment of the present invention.

FIG. 12, shows a nonlimiting example of determining a temperature in a deposition reactor. Various temperatures were selected between T and T+/−5° C. where T is a temperature within a range where the Si epitaxial layer thickness is temperature sensitive such as, for example, a temperature between 650 and 800° C. A first deposition reactor is heated to each one of the respective selected temperatures, using a first heating device and a first temperature monitoring device, and a first silicon epitaxial layer is deposited above a first silicon germanium epitaxial layer on a substrate in the first deposition reactor at each one of the respective selected temperatures. A thickness of each respective one of the first silicon epitaxial layers is measured using XRR. A plot 1210 is generated including the measured thickness of each respective one of the first silicon epitaxial layers as a function of the respective selected temperature (° C.). As illustrated, the thickness of the first silicon epitaxial layer at T−5° C. is measured as 317.1 angstroms (A), at T° C. is measured as 376.6 A and at T+5° C. is measured as 447.5 A. As shown, a correlation coefficient is calculated for the plot 1210 as 0.9975. A second deposition reactor is subsequently heated to approximately T° C. using a second heating device and a second temperature monitoring device. A second silicon epitaxial layer is deposited above a second silicon germanium epitaxial layer on a second substrate in the second deposition reactor at approximately T° C. A thickness of the second silicon epitaxial layer is measured using XRR, shown along plot 1220, and compared to the first silicon epitaxial layer thickness at T° C. for plot 1210. As illustrated, the thickness of the second silicon epitaxial layer at T° C. is measured as 368.8 A. The measured thickness of the second silicon epitaxial layer (plot 1220) is calculated as 7.8 A smaller than the first silicon epitaxial layer thickness at T° C. (plot 1210). Thus, the actual temperature in the second deposition reactor is determined to be less than that indicated on the second temperature measuring device. In the present example, the actual temperature in the deposition reactor is determined to be approximately T−0.87° C.

Figure 13:
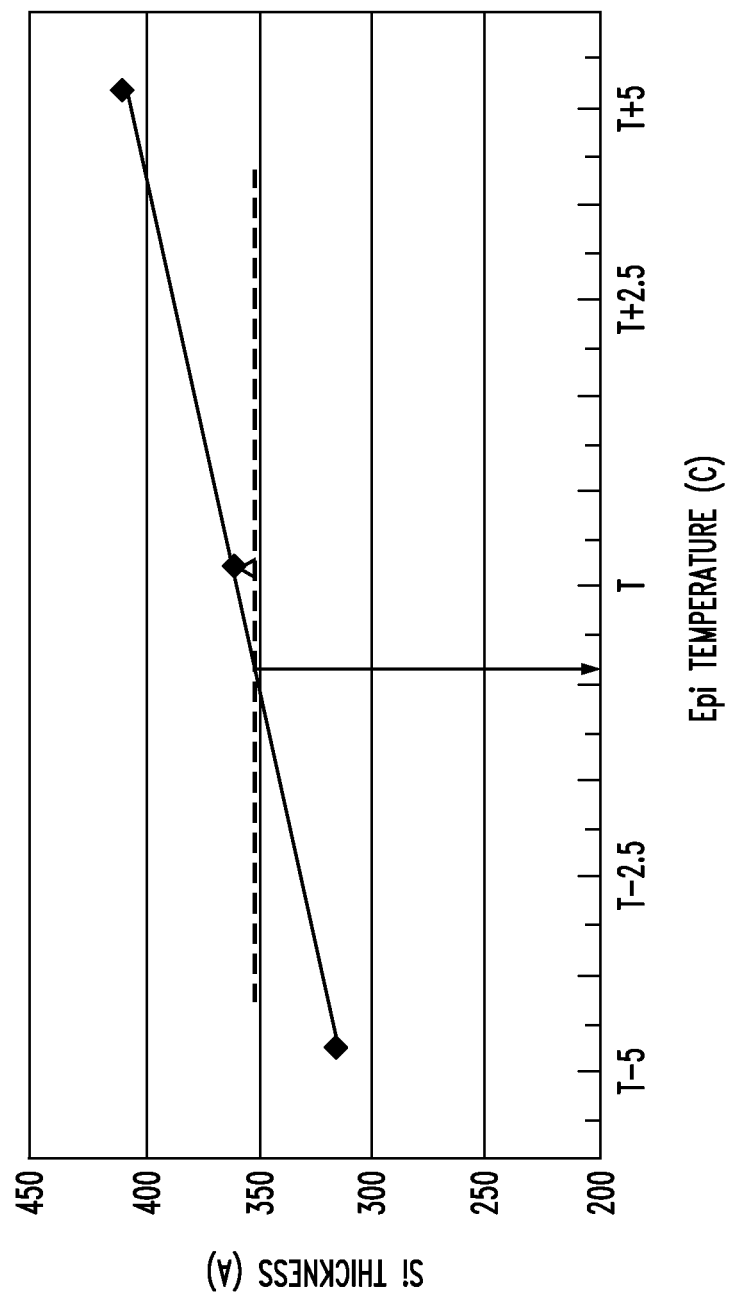
FIG. 13 is a plot showing a nonlimiting example of determining a temperature in a deposition reactor according to an embodiment of the present invention.

FIG. 13 shows a nonlimiting example of determining a temperature in a deposition reactor. Various temperatures were selected between T and T+1-5° C. where T is a temperature within a range where the Si epitaxial layer thickness is temperature sensitive, such as, for example, a temperature between 650 and 800° C. A first deposition reactor is heated to each one of the respective selected temperatures, using a first heating device and a first temperature monitoring device, and a first silicon epitaxial layer is deposited above a first silicon germanium epitaxial layer on a substrate in the first deposition reactor at each one of the respective selected temperatures. A thickness of each respective one of the first silicon epitaxial layers is measured using XRR. A plot 1310 is generated including the measured thickness of each respective one of the first silicon epitaxial layers as a function of the respective selected temperature (° C.). As illustrated, the thickness of the first silicon epitaxial layer at T−5° C. is measured as 314.8 A, at T° C. is measured as 358.8 A and at T+5° C. is measured as 409.5 A. As shown, a correlation coefficient is calculated for the plot 1310 as 0.9983. A second deposition reactor is subsequently heated to approximately T° C. using a second heating device and a second temperature monitoring device. A second silicon epitaxial layer is deposited above a second silicon germanium epitaxial layer on a second substrate in the second deposition reactor at approximately T° C. A thickness of the second silicon epitaxial layer is measured using XRR, shown along plot 1320, and compared to the first silicon epitaxial layer thickness at T° C. for plot 1310. As illustrated, the thickness of the second silicon epitaxial layer at T° C. is measured as 353.4 A. The measured thickness of the second silicon epitaxial layer (plot 1320) is calculated as 5.4 A smaller than the first silicon epitaxial layer thickness at T° C. (plot 1310). Thus, the actual temperature in the second deposition reactor is determined to be less than that indicated on the second temperature measuring device. In the present example, the actual temperature in the deposition reactor is determined to be approximately T−0.8° C.

FIG. 14 is a flow chart illustrating a reactor method. At block 1410, a first and a second temperature measuring device are provided for generating a signal indicative of a temperature within each respective one of a first and a second deposition reactor. In some embodiments, each respective one of the first and the second temperature measuring devices may be positioned at a location in the respective deposition reactor for measuring a temperature at the center of the substrate, and one or more temperature measuring devices may be positioned for measuring the temperature at one or more edges of the substrate. One or more of each respective one of the first and the second temperature measuring devices can be configured to measure a temperature at alternative and/or additional locations in the deposition reactor. In some embodiments, the first and the second measuring devices are equivalent and positioned equivalently in the respective deposition reactor.

At block 1420, each respective one of the first and second deposition reactors is heated to approximately a predetermined temperature using each respective one of the first and second temperature measuring devices. The preferred method involves establishing process conditions in each respective one of the first and second deposition reactors such that the steps described below and illustrated at block 1440 and 1465 respectively are surface reaction controlled. In an embodiment, the predetermined temperature is approximately 500° C. to approximately 900° C. At block 1430, a first epitaxial layer of silicon germanium is deposited on a first substrate in the first deposition reactor. At block 1440, a first epitaxial layer of silicon is deposited above the first silicon germanium epitaxial layer. At block 1450, the thickness of the first silicon epitaxial layer is measured. At block 1460, a second epitaxial layer of silicon germanium is deposited on a second substrate in the second deposition reactor, At block 1465, a second epitaxial layer of silicon is deposited above the second silicon germanium epitaxial layer. At block 1470, a thickness of the second silicon epitaxial layer is measured.

With reference to the description provided for FIG. 8, a correlation coefficient is determined for each respective one of the first and second deposition reactors. At block 1480, the measured thickness of the first silicon epitaxial layer is compared with the measured thickness of the second silicon epitaxial layer. At block 1490, a temperature in the second deposition reactor may be modified based on the determined correlation coefficient for the second deposition reactor and the comparison of the measured silicon epitaxial layer thicknesses.

As shown by the various configurations and embodiments illustrated in FIGS. 1-14, various methods for determining a temperature in a deposition reactor have been described.

While preferred embodiments of the present invention have been described, it is to be understood that the embodiments described are illustrative only and that the scope of the invention is to be accorded a full range of equivalents, many variations and modifications naturally occurring to those of skill in the art from a perusal hereof.

Furthermore, the above examples are illustrative only and are not intended to limit the scope of the disclosure as defined by the appended claims. It will be apparent to those skilled in the art that various modifications and variations can be made in the methods of the present subject matter without departing from the spirit and scope of the disclosure. Thus, it is intended that the claims cover the variations and modifications that may be made by those of ordinary skill in the art.

What we claim is:

1. A method of determining a temperature in a deposition reactor, comprising:
   a) heating the deposition reactor to approximately a first temperature using a heating device and a temperature measuring device;
   b) depositing a first epitaxial layer of silicon germanium on a substrate;
   c) depositing a second epitaxial layer of silicon above the first epitaxial layer;
   d) measuring the thickness of the second epitaxial layer;
   e) comparing the measured thickness of the second epitaxial layer with an expected thickness of the second epitaxial layer corresponding to the first temperature; and
   f) determining the temperature in the deposition reactor using the measured thickness of the second epitaxial layer and a known relationship between the thickness of the second epitaxial layer and the temperature in the deposition reactor.

2. The method of claim 1, wherein step (f) includes:
   determining the temperature in the deposition reactor using the measured thickness of the second epitaxial layer, the known relationship, and the expected thickness of the second epitaxial layer.

3. The method of claim 2, further comprising:
   adjusting a temperature indicated on the temperature measuring device to the determined temperature based on the comparison of the measured thickness and the further expected thickness.

4. The method of claim 3, wherein the step of adjusting the temperature measuring device comprises automatically adjusting the temperature indicated on the temperature measuring device.

5. The method of claim 1, further comprising:
   establishing process conditions in the deposition reactor such that the step of depositing the second epitaxial layer is surface reaction controlled.

6. The method of claim 5, wherein the first temperature is between approximately 650 degrees Celsius and approximately 800 degrees Celsius.

7. The method of claim 1, further comprising:
   a) selecting two or more respectively different temperatures for the deposition reactor;
   b) providing a respective substrate for each one of the selected temperatures;
   c) heating the deposition reactor to each one of the selected temperatures using the heating device and the temperature measuring device;
   d) depositing a respective first epitaxial layer of silicon germanium on each respective one of the substrates;
   e) depositing a respective second epitaxial layer of silicon on each respective one of the first epitaxial layers at each respective one of the selected temperatures;
   f) measuring the thickness of each respective one of the second epitaxial layers of silicon;
   g) associating the measured thickness of each respective one of the second epitaxial layers of silicon with the respective selected temperature measured by the temperature measuring device;
   h) determining a correlation coefficient using each one of the associated measured thicknesses and the respective selected temperature measured by the temperature measuring device;

i) determining the temperature in the deposition reactor using a measured thickness of a respective different epitaxial layer of silicon deposited above a respective different epitaxial layer of silicon germanium on an additional substrate and the correlation coefficient; and
j) automatically calibrating the temperature measuring device using the determined temperature and the correlation coefficient.

8. The method of claim 7, wherein each one of the selected temperatures is between approximately 650 degrees Celsius and approximately 800 degrees Celsius.

9. The method of claim 8, wherein the range between each one of the selected temperatures is approximately 10 degrees Celsius.

10. The method of claim 1, wherein the steps of depositing the first and second epitaxial layer comprise chemical vapor deposition (CVD).

11. The method of claim 1, wherein the deposition reactor is a cold wall CVD reactor.

12. A method, comprising:
a) heating a deposition reactor;
b) providing a temperature measuring device for generating a signal indicative of a temperature within the deposition reactor;
c) heating the deposition reactor to each of a plurality of temperatures measured by the temperature measuring device;
d) depositing a first epitaxial layer of silicon germanium on a first substrate at each respective one of the plurality of temperatures;
e) depositing a second epitaxial layer of silicon on the first epitaxial layer at each respective one of the plurality of temperatures;
f) measuring the thickness of the second epitaxial layer at each respective one of the plurality of temperatures;
g) associating the measured thickness of the second epitaxial layer with the respective one of each one of the plurality of temperatures measured by the temperature measuring device;
h) heating the deposition reactor to approximately one of the plurality of temperatures as indicated by the temperature measuring device;
i) depositing a third epitaxial layer of silicon germanium on a second substrate in the deposition reactor at the approximately one of the plurality of temperatures as indicated by the temperature measuring device;
j) depositing a fourth epitaxial layer of silicon on the third epitaxial layer at the approximately one of the plurality of temperatures as indicated by the temperature measuring device;
k) measuring the thickness of the fourth epitaxial layer at the approximately one of the plurality of temperatures as indicated by the temperature measuring device;
l) comparing the measured thickness of the fourth epitaxial layer with the measured thickness of the second epitaxial layer;
m) determining the difference in temperature between the temperature indicated by the temperature measuring device and the temperature in the deposition reactor based on the comparison of the measured thicknesses; and
n) calibrating the temperature measuring device using the determined difference in temperature and based on the comparison of the measured thicknesses.

13. The method of claim 12, wherein the step of calibrating the temperature measuring device comprises automatically calibrating the temperature measuring device.

14. The method of claim 12, wherein the predetermined temperature is between approximately 650 degrees Celsius and approximately 800 degrees Celsius.

15. A method, comprising:
a) heating a first deposition reactor to a first temperature measured by a temperature measuring device using a heating device;
b) depositing a first epitaxial layer of silicon germanium on a first substrate in the first deposition reactor;
c) depositing a first epitaxial layer of silicon above the first silicon germanium epitaxial layer;
d) measuring the thickness of the first silicon epitaxial layer at the first temperature measured by the temperature measuring device;
e) heating a second deposition reactor to approximately the first temperature using a heating device wherein the first temperature is indicated by the temperature measuring device;
f) depositing a second epitaxial layer of silicon germanium on a second substrate in the second deposition reactor;
g) depositing a second epitaxial layer of silicon above the second silicon germanium epitaxial layer;
h) measuring the thickness of the second silicon epitaxial layer at the first temperature indicated by the temperature measuring device;
i) comparing the measured thickness of the first silicon epitaxial layer with the measured thickness of the second silicon epitaxial layer;
j) calibrating the temperature measuring device using the temperature indicated by the temperature measuring device and based on the comparison of the measured silicon epitaxial layer thicknesses; and
k) modifying a temperature in the second deposition reactor measured by the calibrated temperature measuring device based on the comparison of the measured silicon epitaxial layer thicknesses.

16. The method of claim 15, wherein the first temperature is between approximately 650 degrees Celsius and approximately 800 degrees Celsius.

17. The method of claim 16, further comprising:
a) heating the first deposition reactor to a plurality of further temperatures measured by the temperature measuring device;
b) depositing the first epitaxial layer of silicon germanium on the first substrate at each respective one of the plurality of further temperatures;
c) depositing the second epitaxial layer of silicon on the first epitaxial layer at each respective one of the plurality of further temperatures;
d) measuring the thickness of the second epitaxial layer at each respective one of the plurality of further temperatures;
e) associating the measured thickness of the second epitaxial layer with the respective one of each one of the plurality of further temperatures measured by the temperature measuring device;
f) determining a correlation coefficient using each one of the associated measured thicknesses and the respective plurality of further temperatures measured by the temperature measuring device for the first deposition reactor; and
g) modifying the temperature in the second deposition reactor measured by the calibrated temperature measuring device based on the determined correlation coefficient and the comparison of the measured silicon epitaxial layer thicknesses.

18. The method of claim 15, wherein the step of calibrating the temperature measuring device comprises automatically calibrating the temperature measuring device.

19. The method of claim 12, further comprising:
a) determining a correlation coefficient using each one of the associated measured thicknesses of the second epitaxial layer and the respective selected temperature measured by the temperature measuring device;
b) determining the difference in temperature between the temperature indicated by the temperature measuring device and the temperature in the deposition reactor based on the determined correlation coefficient and the comparison of the measured thicknesses; and
c) calibrating the temperature measuring device using the determined difference in temperature and based on the determined correlation coefficient and the comparison of the measured thicknesses.

* * * * *